(12) United States Patent
Ma (10) Patent No.: US 10,692,441 B2
(45) Date of Patent: Jun. 23, 2020

(54) DRIVE CIRCUIT AND DRIVE METHOD FOR FOLDABLE DISPLAY PANEL AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 108 days.

(21) Appl. No.: 15/552,011

(22) PCT Filed: Feb. 22, 2017

(86) PCT No.: PCT/CN2017/074394
§ 371 (c)(1),
(2) Date: Aug. 18, 2017

(87) PCT Pub. No.: WO2018/018886
PCT Pub. Date: Feb. 1, 2018

(65) Prior Publication Data
US 2018/0233091 A1    Aug. 16, 2018

(30) Foreign Application Priority Data
Jul. 29, 2016    (CN) .......................... 2016 1 0615542

(51) Int. Cl.
*G09G 3/3266* (2016.01)
*G09G 3/3291* (2016.01)
(Continued)

(52) U.S. Cl.
CPC ............. *G09G 3/3291* (2013.01); *G09G 3/20* (2013.01); *G09G 3/3208* (2013.01); *G11C 19/28* (2013.01);
(Continued)

(58) Field of Classification Search
CPC ......... G09G 2300/026; G09G 2360/04; G09G 3/3674–3681; G09G 2310/0264–0297
See application file for complete search history.

(56) References Cited

U.S. PATENT DOCUMENTS

2006/0267909 A1* 11/2006 Hsu ...................... G09G 3/3677
345/100
2007/0232336 A1* 10/2007 Kim ...................... G06F 1/1626
455/466
(Continued)

FOREIGN PATENT DOCUMENTS

CN        202058412 U    11/2011
CN        103208250 A     7/2013
(Continued)

OTHER PUBLICATIONS

Search Report and Written Opinion dated Jun. 1, 2017 from State Intellectual Property Office of the P.R. China.
(Continued)

*Primary Examiner* — Sanghyuk Park
(74) *Attorney, Agent, or Firm* — Dilworth & Barrese, LLP.; Michael J. Musella, Esq.

(57) ABSTRACT

A drive circuit, a display panel, a display device and a drive method. The drive circuit includes a plurality of shift registers; a first switch circuit connected with the shift registers, which is configured to selectively output output signals of the shift registers or a first voltage based on a first control signal and a second control signal; and a second switch circuit connected with the shift registers, which is configured to selectively output the output signals of the shift registers or the first voltage based on a third control signal and a fourth control signal. A set of shift registers can simultaneously or individually drive two display regions.

16 Claims, 4 Drawing Sheets

(51) Int. Cl.
*G09G 3/20* (2006.01)
*G09G 3/3208* (2016.01)
*G11C 19/28* (2006.01)
*H05K 1/18* (2006.01)

(52) U.S. Cl.
CPC ........... *G11C 19/287* (2013.01); *H05K 1/189* (2013.01); *G09G 2300/0809* (2013.01); *G09G 2310/0267* (2013.01); *G09G 2310/0281* (2013.01); *G09G 2310/0286* (2013.01); *G09G 2380/02* (2013.01)

(56) References Cited

U.S. PATENT DOCUMENTS

| | | | |
|---|---|---|---|
| 2008/0100558 A1* | 5/2008 | Yu | G09G 3/3677 345/100 |
| 2009/0102778 A1 | 4/2009 | Tu | |
| 2010/0109996 A1 | 5/2010 | Park et al. | |
| 2011/0187646 A1* | 8/2011 | Mahmoud | G06F 3/02 345/168 |
| 2011/0234574 A1 | 9/2011 | Tanaka et al. | |
| 2012/0194773 A1* | 8/2012 | Kim | G02F 1/13336 349/139 |
| 2013/0293529 A1 | 11/2013 | You et al. | |
| 2017/0148419 A1 | 5/2017 | Zhang et al. | |
| 2017/0287402 A1 | 10/2017 | Toyomura et al. | |

FOREIGN PATENT DOCUMENTS

| | | |
|---|---|---|
| CN | 103943085 A | 7/2014 |
| CN | 104183225 A | 12/2014 |
| CN | 104821138 A | 8/2015 |
| CN | 104851589 A | 8/2015 |
| CN | 104916249 A | 9/2015 |
| CN | 105304021 A | 2/2016 |
| CN | 105304055 A | 2/2016 |
| CN | 105702189 A | 6/2016 |
| CN | 105976759 A | 9/2016 |
| EP | 2927901 A2 | 10/2015 |

OTHER PUBLICATIONS

First Chinese Office Action dated Dec. 27, 2017.
Extended European Search Report issued by the European Patent Office dated Nov. 29, 2019.

* cited by examiner

DRIVE CIRCUIT AND DRIVE METHOD FOR FOLDABLE DISPLAY PANEL AND DISPLAY DEVICE

TECHNICAL FIELD

Embodiments of the present disclosure relate to a drive circuit, a display panel, a display device and a drive method.

BACKGROUND

In the display field, organic light-emitting diode (OLED) display panels have characteristics of being self-luminous, having high contrast, thin thickness, wide viewing angle, fast response, being capable of being used for flexible panels, having wide operating temperature range, being easy to manufacture and so on, and have a broad prospect of development.

Gate-driver on Array (GOA) technology is a technology in which the gate drive circuit is directly integrated in the array substrate of the display device by the photolithography process. A GOA circuit typically comprises a plurality of cascaded shift registers, each of which corresponds to a row of gate lines.

SUMMARY

An embodiment of the present disclosure provides a drive circuit, comprising: a plurality of shift registers; a first switch circuit connected with the shift registers, which is configured to selectively output output signals of the shift registers or a first voltage based on a first control signal and a second control signal; and a second switch circuit connected with the shift registers, which is configured to selectively output the output signals of the shift registers or the first voltage based on a third control signal and a fourth control signal.

For example, in the drive circuit of an embodiment of the present disclosure, the first switch circuit comprises: a first control sub-circuit which is configured to selectively output the first voltage or a second voltage to a first node based on the first control signal and the second control signal; and a plurality of first switch sub-circuits, which are configured to selectively output the output signals of the shift registers or the first voltage to a first display screen based on the first control signal and the voltage of the first node, and the second switch circuit comprises: a second control sub-circuit which is configured to selectively output the first voltage or the second voltage to a second node based on the third control signal and the fourth control signal; and a plurality of second switch sub-circuits, which are configured to selectively output the output signals of the shift registers or the first voltage to a second display screen based on the fourth control signal and the voltage of the second node.

For example, in the drive circuit of an embodiment of the present disclosure, the first control sub-circuit comprises a first transistor and a second transistor, each of the first switch sub-circuits comprises a fifth transistor and a sixth transistor; and the second control sub-circuit comprises a third transistor and a fourth transistor, and each of the second switch sub-circuits comprises a seventh transistor and an eighth transistor.

For example, in the drive circuit of an embodiment of the present disclosure, a first electrode of the first transistor is connected with a first voltage terminal to receive the first voltage, a gate of the first transistor is connected with a first control signal terminal to receive the first control signal, and a second electrode of the first transistor is connected with the first node; a first electrode of the second transistor is connected with the first node, a gate of the second transistor is connected with a second control signal terminal to receive the second control signal, and a second electrode of the second transistor is connected with a second voltage terminal to receive the second voltage; a first electrode of the third transistor is connected with the second node, a gate of the third transistor is connected with a third control signal terminal to receive the third control signal, and a second electrode of the third transistor is connected with the second voltage terminal to receive the second voltage; a first electrode of the fourth transistor is connected with the first voltage terminal to receive the first voltage, a gate of the fourth transistor is connected with a fourth control signal terminal to receive the fourth control signal, and a second electrode of the fourth transistor is connected with the second node; a first electrode of the fifth transistor is connected with the first voltage terminal to receive the first voltage, a gate of the fifth transistor is connected with the first control signal terminal to receive the first control signal, and a second electrode of the fifth transistor is connected with a second electrode of the sixth transistor; a first electrode of the sixth transistor is connected with the shift registers to receive the output signals of the shift registers, and a gate of the sixth transistor is connected with the first node; a first electrode of the seventh transistor is connected with the first voltage terminal to receive the first voltage, a gate of the seventh transistor is connected with the fourth control signal terminal to receive the fourth control signal, and a second electrode of the seventh transistor is connected with a second electrode of the eighth transistor; a first electrode of the eighth transistor is connected with the shift registers to receive the output signals of the shift registers, and a gate of the eighth transistor is connected with the second node.

For example, in the drive circuit of an embodiment of the present disclosure, the plurality of the first switch sub-circuits, the plurality of the second switch sub-circuits and the plurality of the shift registers correspond to each other one by one.

For example, in the drive circuit of an embodiment of the present disclosure, the first transistor, the second transistor, the third transistor, the fourth transistor, the fifth transistor, the sixth transistor, the seventh transistor and the eighth transistor are P-type transistors.

For example, in the drive circuit of an embodiment of the present disclosure, the first transistor, the second transistor, the third transistor, the fourth transistor, the fifth transistor, the sixth transistor, the seventh transistor and the eighth transistor are thin film transistors.

Further an embodiment of the present disclosure provides a display panel, comprising the drive circuit according to any embodiment of the present disclosure.

For example, the display panel of an embodiment of the present disclosure further comprises a first display region and a second display region, wherein the first switch circuit is configured to selectively output the output signals of the shift registers or the first voltage to the first display region based on the first control signal and the second control signal, the second switch circuit is configured to selectively output the output signals of the shift registers or the first voltage to the second display region based on the third control signal and the fourth control signal.

For example, the display panel of an embodiment of the present disclosure further comprises a flexible circuit board, wherein the flexible circuit board is provided between the first display region and the second display region and the drive circuit is provided on the flexible circuit board.

For example, the display panel of an embodiment of the present disclosure is a foldable display panel and is foldable at a position between the first display region and the second display region.

For example, the display panel of an embodiment of the present disclosure further comprises a plurality of sub-pixel units, wherein light emitting regions of a part of the sub-pixel units overlap the drive circuit.

For example, in the display panel of an embodiment of the present disclosure, light emitting regions of the plurality of sub-pixel units cover the drive circuit.

For example, in the display panel of an embodiment of the present disclosure, the plurality of sub-pixel units comprise a first sub-pixel unit and a second sub-pixel unit, and a light emitting region of the first sub-pixel unit has a size larger than that of a light emitting region of the second sub-pixel unit.

For example, in the display panel of an embodiment of the present disclosure, a part of a light emitting region of the first sub-pixel unit overlaps the drive circuit.

Still further an embodiment of the present disclosure provides a display device, comprising the display panel of any embodiment of the present disclosure.

For example, the display device of an embodiment of the present disclosure further comprises a full screen control switch, a first display region control switch, and a second display region control switch, wherein the full screen control switch is configured for switching on or switching off the first display region and the second display region simultaneously, the first display region control switch is configured for switching on or switching off the first display region individually, and the second display region control switch is configured for switching on or switching off the second display region individually.

Still further an embodiment of the present disclosure provides a method of driving the drive circuit of any embodiment of the present disclosure, comprising: in a case that the first display region and the second display region display simultaneously, setting the first control signal to be an OFF voltage, setting the second control signal to be an ON voltage, setting the third control signal to be an ON voltage and setting the fourth control signal to be an OFF voltage; in a case that the first display region displays individually, setting the first control signal to be an OFF voltage, setting the second control signal to be an ON voltage, setting the third control signal to be an OFF voltage and setting the fourth control signal to be an ON voltage; and in a case that the second display region displays individually, setting the first control signal to be an ON voltage, setting the second control signal to be an OFF voltage, setting the third control signal to be an ON voltage and setting the fourth control signal to be an OFF voltage.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In the following, technical solutions of the embodiments of the present disclosure will be described in a clearly and fully understandable way in connection with the drawings; with reference to the non-limiting exemplary embodiments, which are illustrated in the drawings and detailed described in the following, the exemplary embodiments and the features and favorable details of the present disclosure will be described more comprehensively. It should be noted that the features in the drawings are not necessarily illustrated in proportion. The present disclosure omits the descriptions of known materials, components, and processing technologies to avoid the vagueness occurring to the exemplary embodiments of the present disclosure. The examples are intended for helping understand the implementation methods of the embodiments of the present disclosure, such that those skilled in the art can implement the exemplary embodiments. Therefore, those examples are not limitative of the scope of the embodiment of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the embodiments of the present disclosure, identical or similar numerals represent identical or similar components In a foldable display device, in the case that shift registers are provided for the two display screens independently, after the two screens are folded in a reverse manner, if only one screen is required to perform a normal display, then the other screen needs to be in a state of displaying a pure black picture, that is, still in the operating state, which results in an increase in the power consumption of the whole panel and thus a waste of a certain degree.

An embodiment of the present disclosure provides a drive circuit, a display panel, a display device and a drive method. One set of shift registers can be used to simultaneously or individually drive the two display regions, thereby reducing the amount of the shift registers, achieving independent operation of the display regions, reducing power consumption and saving energy.

Figure 1:
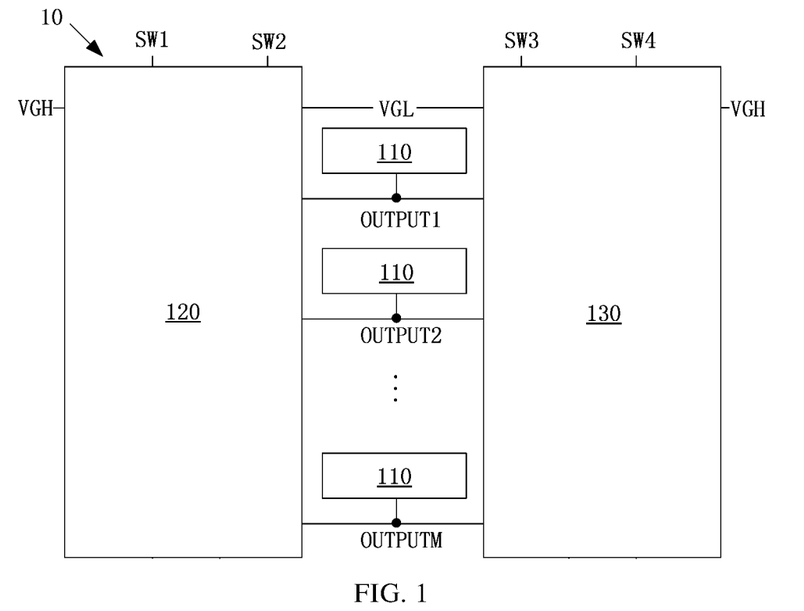
FIG. 1 is a first illustrative view of a drive circuit provided by an embodiment of the present disclosure.

An embodiment of the present disclosure provides a drive circuit 10. As illustrated in FIG. 1, the drive circuit 10 comprises a plurality of shift registers 110 (for example, M shift registers 110), a first switch circuit 120 connected with the shift registers 110, and a second switch circuit 130 connected with the shift registers 110. The first switch circuit 120 is configured to selectively output the output signals OUTPUT of the shift registers 110 (for example, the output signals OUTPUT of the shift registers include OUTPUT1, OUTPUT2, . . . , OUTPUTM) or a first voltage VGH based on a first control signal SW1 and a second control signal SW2. The second switch circuit 130 is configured to selectively output the output signals OUTPUT of the shift registers or a first voltage VGH based on a third control signal SW3 and a fourth control signal SW4.

For example, in an embodiment of the present disclosure, the first voltage VGH is a high voltage (for example, 5V) for instance and the second voltage VGL is a low voltage (for example, 0V) for instance.

Figure 2:
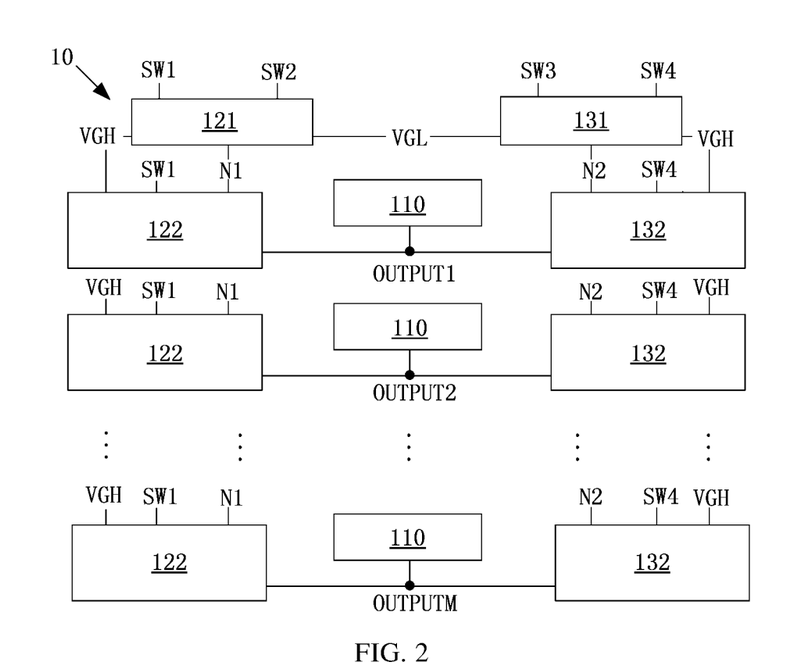
FIG. 2 is a second illustrative view of a drive circuit provided by an embodiment of the present disclosure.

For example, as illustrated in FIG. 2, in the drive circuit 10 provided by an embodiment of the present disclosure, the first switch circuit 120 comprises a first control sub-circuit 121 and a plurality of first switch sub-circuits 122. The first control sub-circuit 121 is configured to selectively output the first voltage VGH or the second voltage VGL to a first node N1 based on the first control signal SW1 and the second control signal SW2. The first switch sub-circuits 122 are configured to selectively output the output signals OUTPUT of the shift registers 110 or the first voltage VGH to a first display screen (not shown in FIG. 2) based on the first control signal SW1 and the voltage of the first node N1. The second switch circuit 130 comprises a second control sub-circuit 131 and a plurality of second switch sub-circuits 132. The second control sub-circuit 131 is configured to selectively output the first voltage VGH or the second voltage VGL to a second node N2 based on the third control signal SW3 and the fourth control signal SW4. The second switch sub-circuits 132 are configured to selectively output the output signals OUTPUT of the shift registers 110 or the first voltage VGH to a second display screen (not shown in FIG. 2) based on the fourth control signal SW4 and the voltage of the second node N2.

Figure 3:
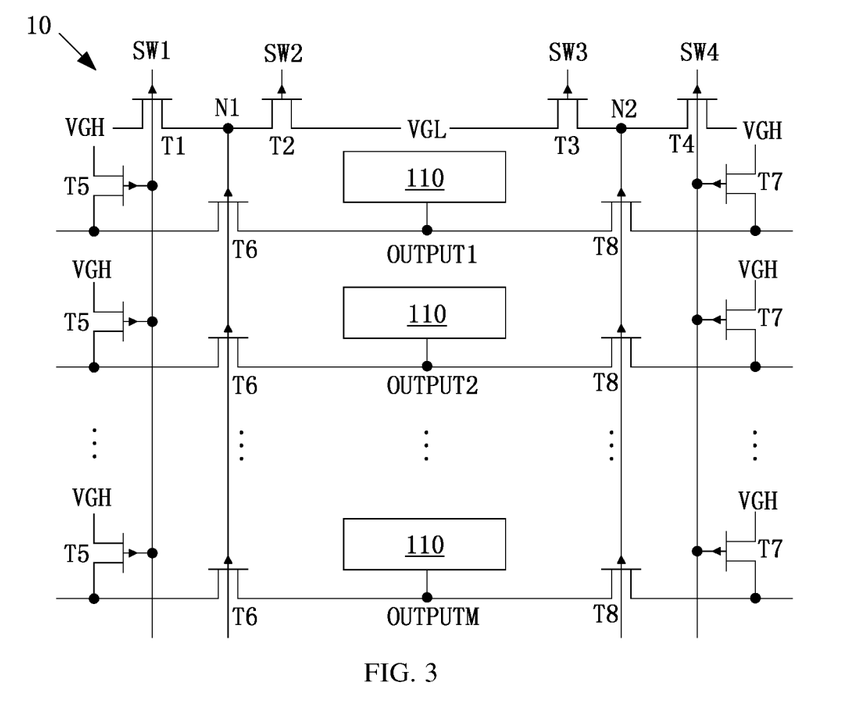
FIG. 3 is a third illustrative view of a drive circuit provided by an embodiment of the present disclosure

For example, as illustrated in FIG. 3, in the drive circuit 10 provided by an embodiment of the present disclosure, the first control sub-circuit 121 comprises a first transistor T1 and a second transistor T2. Each of the first switch sub-circuits 122 comprises a fifth transistor T5 and a sixth transistor T6. The second control sub-circuit 131 comprises a third transistor T3 and a fourth transistor T4. Each of the second switch sub-circuits 132 comprises a seventh transistor T7 and an eighth transistor T8.

For example, as illustrated in FIG. 3, in the drive circuit 10 provided by an embodiment of the present disclosure, the first electrode of the first transistor T1 is connected with a first voltage terminal to receive the first voltage VGH, the gate of the first transistor T1 is connected with a first control signal terminal to receive the first control signal SW1, and the second electrode of the first transistor T1 is connected with the first node N1. The first electrode of the second transistor T2 is connected with the first node N1, the gate of the second transistor T2 is connected with a second control signal terminal to receive the second control signal SW2, and the second electrode of the second transistor T2 is connected with a second voltage terminal to receive the second voltage VGL. The first electrode of the third transistor T3 is connected with the second node N2, the gate of the third transistor T3 is connected with a third control signal terminal to receive the third control signal SW3, and the second electrode of the third transistor T3 is connected with the second voltage terminal to receive the second voltage VGL. The first electrode of the fourth transistor T4 is connected with the first voltage terminal to receive the first voltage VGH, the gate of the fourth transistor T4 is connected with a fourth control signal terminal to receive the fourth control signal SW4, and the second electrode of the fourth transistor T4 is connected with the second node N2. The first electrode of the fifth transistor T5 is connected with the first voltage terminal to receive the first voltage VGH, the gate of the fifth transistor T5 is connected with the first control signal terminal to receive the first control signal SW1, and the second electrode of the fifth transistor T5 is connected with the second electrode of the sixth transistor T6. The first electrode of the sixth transistor T6 is connected with a shift register 110 to receive the output signal of the shift register 110, and the gate of the sixth transistor T6 is connected with the first node N1. The first electrode of the seventh transistor T7 is connected with the first voltage terminal to receive the first voltage VGH, the gate of the seventh transistor T7 is connected with the fourth control signal terminal to receive the fourth control signal SW4, and the second electrode of the seventh transistor T7 is connected with the second electrode of the eighth transistor T8. The first electrode of the eighth transistor T8 is connected with a shift register 110 to receive the output signal of the shift register 110, and the gate of the eighth transistor T8 is connected with the second node N2.

It is to be noted that the drive circuit illustrated in FIG. 3 is a specific implementation of the drive circuit illustrated in FIG. 1 or FIG. 2. The embodiments of the present disclosure comprise, but not limited to, the implementation of the drive circuit as illustrated in FIG. 3. Modifications made to the drive circuit illustrated in FIG. 3 without any creative work should be within the protection scope of the present disclosure.

For example, in the drive circuit 10 provided by an embodiment of the present disclosure, the plurality of the first switch sub-circuits 122, the plurality of the second switch sub-circuits 132 and the plurality of the shift registers 110 correspond to each other one by one. For example, by taking the first row as an example, the first switch sub-circuit 122, the second switch sub-circuit 132 and the shift register 110 of the first row correspond to each other one by one. That is to say, the fifth transistor or the sixth transistor in the switch sub-circuit of the first row is turned on, so as to output the first voltage VGH or the output signal OUTPUT1 of the shift register of the first row; and the seventh transistor or the eighth transistor in the second switch sub-circuit of the first row is turned on, so as to output the first voltage VGH or the output signal OUTPUT1 of the shift register of the first row. The cases of other lines are similar to the first line and will not be repeated here.

For example, in the drive circuit 10 provided by an embodiment of the present disclosure, the first transistor T1, the second transistor T2, the third transistor T3, the fourth transistor T4, the fifth transistor T5, the sixth transistor T6, the seventh transistor T7 and the eighth transistor T8 are P-type transistors.

For example, in the drive circuit provided by an embodiment of the present disclosure, the first transistor T1, the second transistor T2, the third transistor T3, the fourth transistor T4, the fifth transistor T5, the sixth transistor T6, the seventh transistor T7 and the eighth transistor T8 are thin film transistors.

Figure 4:
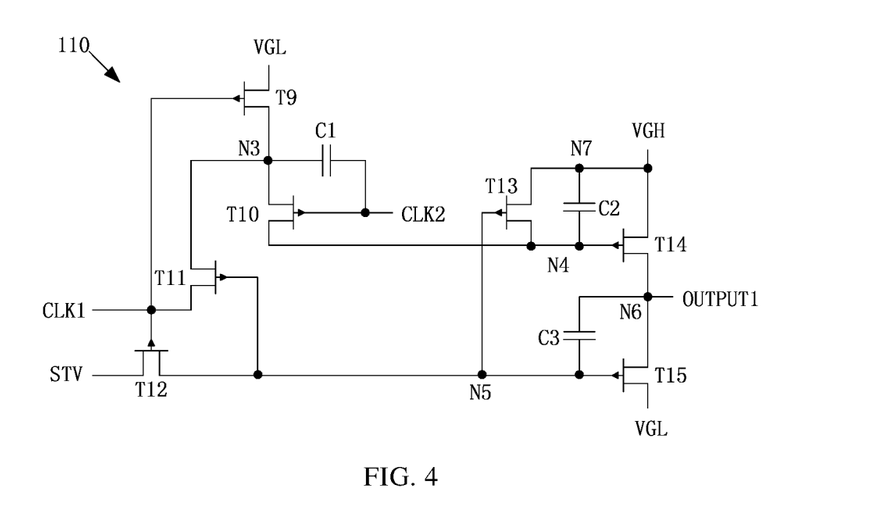
FIG. 4 is an illustrative view of a shift register provided by an embodiment of the present disclosure.

For example, an example of the shift register is illustrated in FIG. 4, and a description is made by taking the shift register of the first row as an example. The shift register 110 comprises the eighth transistor T8, a ninth transistor T9, a tenth transistor T10, an eleventh transistor T11, a twelfth transistor T12, a thirteenth transistor T13, a fourteenth transistor T14, a fifteenth transistor T15, a first capacitor C1, a second capacitor C2 and a third capacitor C3. The first electrode of the ninth transistor T9 is connected with the second voltage terminal to receive the second voltage VGL, the gate of the ninth transistor T9 is connected with a first clock signal terminal to receive a first clock signal CLK1, and the second electrode of the ninth transistor T9 is connected with a third node N3. The first electrode of the tenth transistor T10 is connected with the third node N3, the gate of the tenth transistor T10 is connected with a second clock signal terminal to receive a second clock signal CLK2, and the second electrode of the tenth transistor T10 is connected with a fourth node N4. The first electrode of the eleventh transistor T11 is connected with the third node, the gate of the eleventh transistor T11 is connected with a fifth node, and the second electrode of the eleventh transistor T11 is connected with the first clock signal terminal to receive the first clock signal CLK1. The first electrode of the twelfth transistor T12 is connected with an output control signal terminal to receive an output control signal STV, the gate of the twelfth transistor T12 is connected with the first clock signal terminal to receive the first clock signal CLK1, and the second electrode of the twelfth transistor T12 is connected with the fifth node N5. The first electrode of the thirteenth transistor T13 is connected with a seventh node N7 which is connected with the first voltage terminal to receive the first voltage VGH, the gate of the thirteenth transistor T13 is connected with the fifth node N5, and the second electrode of the thirteenth transistor T13 is connected with the fourth node N4. The first electrode of the fourteenth transistor T14 is connected with a seventh node N7, the gate of the fourteenth transistor T14 is connected with the fourth node N4, and the second electrode of the fourteenth transistor T14 is connected with a sixth node N6 which is configured to output the output signal OUTPUT1 of the shift register. The first electrode of the fifteenth transistor T15 is connected with the sixth node N6, the gate of the fifteenth transistor T15 is connected with the fifth node N5, and the second electrode of the fifteenth transistor T15 is connected with the second voltage terminal to receive the second Voltage VGL. The first terminal of the first capacitor C1 is connected with the third node N3, and the second terminal of the first capacitor C1 is connected with the second clock signal terminal to receive the second clock signal CLK2. The first terminal of the second capacitor C2 is connected with the seventh node N7, and the second terminal of the second capacitor C2 is connected with the fourth node N4. The first terminal of the third capacitor C3 is connected with the sixth node N6, and the second terminal of the third capacitor is connected with the fifth node N5.

It should be noted that the shift register 110 as illustrated in FIG. 4 is only one example in the embodiments of the present disclosure, and the embodiments of the present disclosure comprise, but not limited to, the shift register as illustrated in FIG. 4, and can adopt other shift register(s).

It is to be noted that the capacitors used in the embodiments of the present disclosure each comprise a first terminal and a second terminal, and the first terminal and the second terminal of a capacitor are for example symmetrical, and therefore the first terminal and the second terminal of each of the first capacitor, the second capacitor, and the third capacitor are interchangeable.

It is to be noted that each of the transistors used in the embodiments of the present disclosure can be a thin-film transistor or a field-effect transistors or other switching device having the same characteristics. The source and drain of a transistor used herein can be structurally symmetrical and therefore there is no structural difference between the source and the drain. In the embodiments of the present disclosure, to distinguish the two electrodes of a transistor besides the gate, one of the electrodes is described as a first electrode and the other is described as a second pole. Thus, all or a part of the transistors in the embodiments of the present disclosure can have a first electrode and a second electrode which are interchangeable as required. In addition, the transistors can be divided into P-type transistors and N-type transistors according to the characteristics of the transistors. The embodiments of the present disclosure are described by taking P-type transistors as an example. Based on the description and teachings of the implementation of the P-type transistor by the present disclosure, the implementations of the present disclosure by using the N-type transistors is easily conceivable for one having ordinary skill in the art without any creative work, and thus such implementations are also within the protection scope of the present disclosure.

Figure 5:
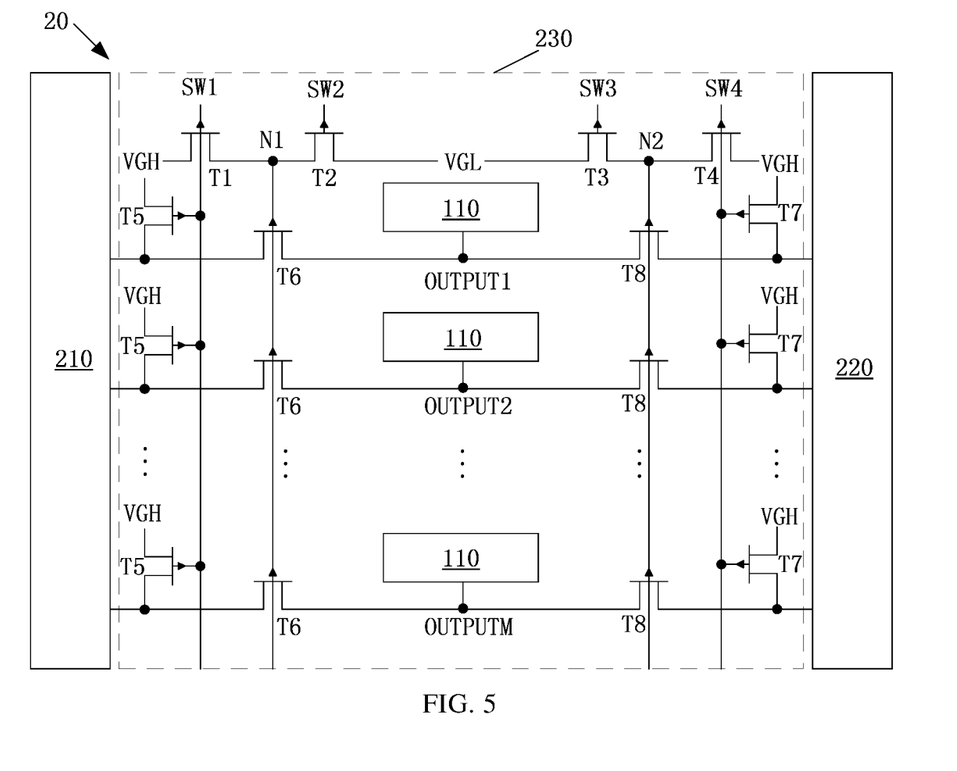
FIG. 5 is a first illustrative view of a display panel provided by an embodiment of the present disclosure.

The embodiments of the present disclosure further provide a display panel 20. As illustrated in FIG. 5, the display panel 20 comprises a drive circuit 10 according to any one of the embodiments of the present disclosure. The display panel 20 can be an organic light emitting diode display (OLED) panel, or can be a liquid crystal display panel (LD), an electronic ink display panel or the like.

For example, the display panel 20 provided by an embodiment of the present disclosure further comprises a first display region 210 and a second display region 220. The first switch circuit 120 is configured to selectively output the output signals OUTPUT of the shift registers 110 (for example, the output signal OUTPUT of the shift registers includes OUTPUT1, OUTPUT2, . . . , OUTPUTM) or the first voltage VGH to the first display region 210 based on the first control signal SW1 and the second control signal SW2. The second switch circuit 130 is configured to selectively output the output signals OUTPUT of the shift registers 110 or the first voltage VGH to the second display region 220 based on the third control signal SW3 and the fourth control signal SW4.

For example, the display panel 20 provided by the embodiment of the present disclosure further comprises a flexible circuit board 230 disposed between the first display region 210 and the second display region 220. The drive circuit 10 is provided on the flexible circuit board 230.

For example, the display panel 20 provided by the embodiment of the present disclosure can be a foldable display panel which can be folded at a position between the first display region 210 and the second display region 220. The first display region 210 and the second display region 220 can be folded so as to form an angle therebetween with the first display region 210 and the second display region 220 overlapped with each other or having display surfaces facing outward.

Figure 6:
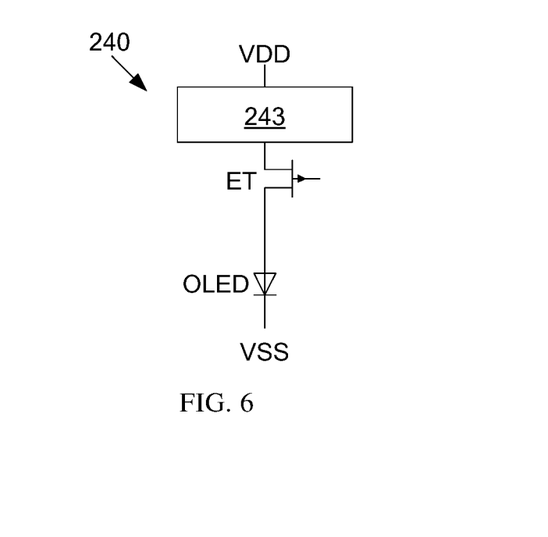
FIG. 6 is an illustrative view of a sub-pixel unit in a display panel provided by an embodiment of the present disclosure.

For example, the display panel 20 provided by the embodiment of the present disclosure further comprises a plurality of sub-pixel units 240. As illustrated in FIG. 6, the sub-pixel unit 240 comprises a light emission control transistor ET, an organic light emitting diode OLED, and a driving control circuit 243.

For example, the driving control circuit 243 is configured to drive the OLED to emit light according to a light emitting data signal. A first terminal of the driving control circuit 243 is connected with a first drive power supply terminal to receive a first drive power supply voltage VDD, and a second terminal of the driving control circuit 243 is connected with a first electrode of the light emission control transistor ET. The gate of the light emission control transistor ET is configured to receive the output signal OUTPUT of a shift register 110 or the first voltage VGH selectively outputted from the drive circuit 10, and a second electrode of the light emission control transistor ET is connected with a first electrode (e.g., the anode) of the OLED. A second electrode of the OLED (e.g., the cathode) is connected with a second drive power supply to receive a second drive power supply voltage VSS.

For example, the driving control circuits 243 and the light emission control transistors ET of the plurality of sub-pixel units 240 are provided in the first display region 210 and the second display region 220.

Figure 7:
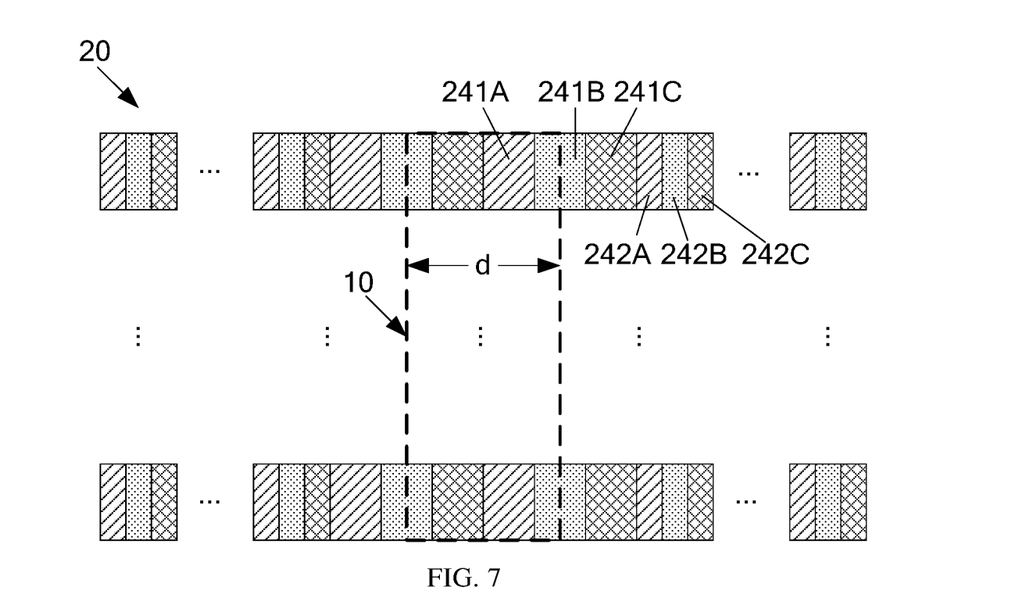
FIG. 7 is a second illustrative view of a display panel provided by an embodiment of the present disclosure.

For example, as illustrated in FIG. 7, the light emitting region (for example, the light emitting region of the OLED) included in a sub-pixel unit 240 overlaps the drive circuit 10 thereof.

For example, as illustrated in FIG. 7, in the display panel 20 provided by the embodiment of the present disclosure, the light emitting regions of the plurality of sub-pixel units 240 (for example, the light emitting regions of the OLEDs in the sub-pixel units 240) cover the drive circuit 10.

For example, as illustrated in FIG. 7, in the display panel 20 provided by the embodiment of the present disclosure, the plurality of sub-pixel units 240 comprise a first sub-pixel unit 241 and a second sub-pixel unit 242. The light emitting region of the first sub-pixel unit 241 comprises a light emitting region 241A of a red pixel unit, a light emitting region 241B of a green pixel unit, and a light emitting region 241C of a blue pixel unit. The light emitting region of the second sub-pixel unit 242 comprises a light emitting region 242A of a red pixel unit, a light emitting region 242B of a green pixel unit, and a light emitting region 242C of a blue pixel unit. The size of the light emitting region of the first sub-pixel unit 241 is larger than the size of the light emitting region of the second sub-pixel unit 242.

For example, in the display panel 20 provided by the embodiment of the present disclosure, the light emitting regions of a part of the first sub-pixel unit 240 overlap the drive circuit 10.

For example, as illustrated in FIG. 7, a lateral length d occupied by the drive circuit 10 is 300 μm. The first display region and the second display region each occupy a lateral length of 150 μm. A lateral length of the light emitting region of one first sub-pixel unit is 100 μm, and a lateral length of the light emitting region of one second sub-pixel unit is 50 μm. By providing three first sub-pixel units in the portions of each row of the first display region and the second display region adjacent to the drive circuit 10, the first sub-pixel units can cover the drive circuit 10. By taking the first row of sub-pixels of the second display region as an example, as illustrated in FIG. 7, the light emitting region 241A of the red pixel unit and one half of the light emitting region 241B of the green pixel unit cover the drive circuit 10, and the other half of the light emitting region 241B of the green pixel unit and the light emitting region 241C of the blue pixel unit cover circuits or circuit components such as the driving control circuit 243 and the light emission control transistor ET. Such arrangement enables seamless splicing display by the first display region and the second display region and improves user experience.

Figure 8:
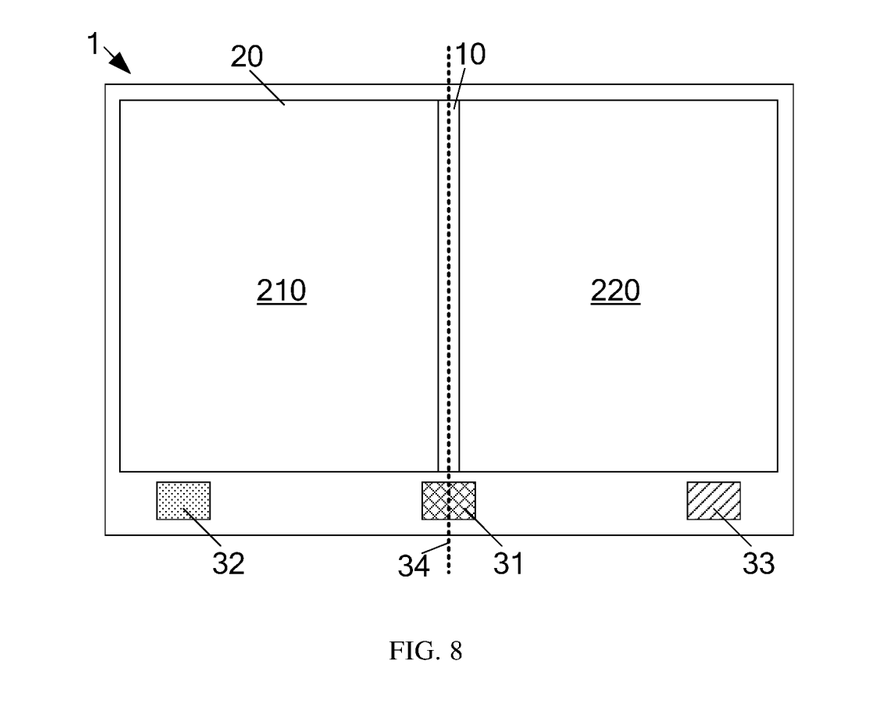
FIG. 8 is an illustrative view of a display device provided by an embodiment of the present disclosure.

An embodiment of the present disclosure further provide a display device 1. As illustrated in FIG. 8, the display device 1 comprises a display panel 20 of any one of the embodiments of the present disclosure.

For example, the display device 1 provided by the embodiment of the present disclosure can further comprise: a full screen control switch 31 for switching on or switching off the first display region 210 and the second display region 220 simultaneously, a first display region control switch 32 for switching on or switching off the first display region 210 individually, and a second display region control switch 33 for switching on or switching off the second display region 220 individually.

For example, the full screen control switch 31, the first display region control switch 32, and the second display region control switch 33 enable the switching on or switching off of the first display region 210 and/or the second display region 220 by setting the first control signal SW1, the second control signal SW2, the third control signal SW3 and the fourth control signal SW4.

It is to be noted that the positions and the shapes of the full screen control switch 31, the first display region control switch 32 and the second display region control switch 33 are not limited to those as illustrated in FIG. 8, but can be of other shapes or provided on other positions of the display panel.

For example, the display device 1 can be folded along a folding rotation axis 34, so that the first display region and the second display region can be spliced into a single display region when the first display region and the second display region are required to display simultaneously. When the first display region or the second display region is required to display individually, the display device 1 can be folded along the folding rotation axis 34, thereby reducing the area occupied by the display device 1 and improving user experience. The full screen control switch 31 can be formed on a side of the display device 1 where a display region is located and connected with signals of both display regions simultaneously.

For example, the display device 1 may further comprise other components such as a power switch (not illustrated in FIG. 8).

An embodiment of the present disclosure further provides a method of driving a drive circuit of any one of the embodiments of the present disclosure, comprising: in a case that the first display region and the second display region display simultaneously, setting the first control signal SW1 to be an OFF voltage, setting the second control signal SW2 to be an ON voltage, setting the third control signal SW3 to be an ON voltage and setting the fourth control signal SW4 to be an OFF voltage; in a case that the first display region displays individually, setting the first control signal SW1 to be an OFF voltage, setting the second control signal SW2 to be an ON voltage, setting the third control signal SW3 to be an OFF voltage and setting the fourth control signal SW4 to be an ON voltage; in a case that the second display region displays individually, setting the first control signal SW1 to be an ON voltage, setting the second control signal SW2 to be an OFF voltage, setting the third control signal SW3 to be an ON voltage and setting the fourth control signal SW4 to be an OFF voltage.

For example, an ON voltage refers to a voltage that conducts the first electrode and the second electrode of a transistor when this voltage is applied to the gate of the transistor, and an OFF voltage refers to a voltage that turns off the conduction between the first electrode and the second electrode of the transistor when this voltage is applied to the gate of the transistor. For example, for a P-type transistor, the ON voltage is for example a low voltage (for example, 0V) and the OFF voltage is for example a high voltage (for example, 5V); for an N-type transistor, the ON voltage is for example a high voltage (for example, 5V) and the OFF voltage is for example a low voltage (for example, 0V). The embodiments of the present disclosure are described by taking the P-type transistor as an example.

If the first display region and the second display region display simultaneously, referring to FIG. 5, the first control signal SW1 is set to be a high voltage, the second control signal SW2 is set to be a low voltage, the third control signal SW3 is set to be a low voltage and the fourth control signal SW4 is set to be a high voltage. The first transistor T1, the fourth transistor T4, the fifth transistor T5 and the seventh transistor T7 are turned off, while the second transistor T2 and the third transistor T3 are turned on. The voltages of the first node N1 and the second node N2 are the second voltage VGL (the second voltage VGL is for example a low voltage), so that the low voltage of the first node N1 conducts the sixth transistor T6 completely and the low voltage of the second node N2 conducts the eighth transistor T8 completely. The output signals OUTPUT of the shift registers 110 (for example, the output signals OUTPUT of the shift registers includes OUTPUT1, OUTPUT2, OUTPUTM) are transmitted to the first display region 210 and the second display region 220 (for example, to the gates of the light emission control transistors ET in the first display region 210 and the second display region 220).

It is to be noted that the output signals OUTPUT of the shift registers 110 comprise, but not limited to, the control signals transmitted to the gates of the light emission control transistors ET for controlling the light emission function, and also can be other signals such as scanning signals for controlling data writing or scanning signals for controlling resetting function.

When the first display region displays individually, the second display region is in a shutdown or sleep state. The first control signal SW1 is set to be a high voltage, the second control signal SW2 is set to be a low voltage, the third control signal SW3 is set to be a high voltage and the fourth control signal SW4 is set to be a low voltage. The first transistor T1 and the fifth transistor T5 are turned off, while the second transistor T2 is turned on. The voltage of the first node N1 is the second voltage VGL (the second voltage VGL is for example a low voltage), so that the low voltage of the first node N1 conducts the sixth transistor T6 completely. The output signals OUTPUT of the shift registers 110 (for example, the output signals OUTPUT of the shift registers includes OUTPUT1, OUTPUT2, OUTPUTM) are transmitted to the first display region 210. The third transistor T3, the fourth transistor T4 and the seventh transistor T7 are turned on. The voltage of the second node N2 is the first voltage VGH (the first voltage VGH is for example a high voltage), so that the high voltage of the second node N2 turns off the eighth transistor T8 completely. The first voltage VGH is transmitted to the second display region 220 (for example, to the gate of the light emission control transistor ET in the second display region 220) via the seventh transistor T7. The second display region is made in a shutdown or sleep state, thereby saving energy.

When the second display region displays individually, the first display region is in a shutdown or sleep state. The first control signal SW1 is set to be a low voltage, the second control signal SW2 is set to be a high voltage, the third control signal SW3 is set to be a low voltage and the fourth control signal SW4 is set to be a high voltage. The fourth transistor T4 and the seventh transistor T7 are turned off, while the third transistor T3 is turned on. The voltage of the second node N2 is the second voltage VGL (the second voltage VGL is for example a low voltage), so that the low voltage of the second node N2 conducts the eighth transistor T8 completely. The output signals OUTPUT of the shift registers 110 (for example, the output signal OUTPUT of the shift registers includes OUTPUT1, OUTPUT2, . . . , OUT-PUTM) are transmitted to the second display region 220. The second transistor T2 is turned off, while the first transistor T1 and the fifth transistor T5 are turned on. The voltage of the first node N1 is the first voltage VGH (the first voltage VGH is for example a high voltage), so that the high voltage of the first node N1 turns off the sixth transistor T6 completely. The first voltage VGH is transmitted to the first display region 210 (for example, to the gate of the light emission control transistor ET in the first display region 210) via the fifth transistor T5. The first display region is made in a shutdown or sleep state, thereby saving energy.

The embodiments of the present disclosure provide a drive circuit, a display panel, a display device and a drive method. In the embodiments of the present disclosure, a set of shift registers can simultaneously or individually drive the two display regions, thereby reducing the amount of the shift registers, achieving independent operation of the display regions, reducing power consumption and saving energy.

Although the present disclosure is conducted in detail through the general illustrative description and specific embodiments, based on the described embodiments of the present disclosure, modifications or improvements can be performed without any inventive work, which would be obvious for those skilled in the related art. These modifications or improvements made without departing from the spirit of the present disclosure should be within the scope that is claimed for protection in the present disclosure.

The application claims priority to the Chinese patent application No. 201610615542.9, filed Jul. 29, 2016, the entire disclosure of which is incorporated herein by reference as part of the present application.

What is claimed is:

1. A drive circuit, comprising:
   a plurality of shift registers;
   a first switch circuit connected with the shift registers, which is configured to selectively output output signals of the shift registers or a first voltage to a first display region of a display panel based on a first control signal and a second control signal; and
   a second switch circuit connected with the shift registers, which is configured to selectively output the output signals of the shift registers or the first voltage to a second display region of the display panel based on a third control signal and a fourth control signal,
   wherein the drive circuit is provided between the first display region and the second display region;
   the first switch circuit comprises a first transistor and a plurality of sixth transistors, a first electrode of the first transistor is connected with a first voltage terminal to receive the first voltage, a gate of the first transistor is connected with a first control signal terminal to receive the first control signal, and a second electrode of the first transistor is connected with the first node, a first electrode of each sixth transistor is connected with the shift registers to receive the output signals of the shift registers, and a gate of each sixth transistor is connected with the first node;
   the second switch circuit comprises a fourth transistor and a plurality of eighth transistors, a first electrode of the fourth transistor is connected with the first voltage terminal to receive the first voltage, a gate of the fourth transistor is connected with a fourth control signal terminal to receive the fourth control signal, and a second electrode of the fourth transistor is connected with the second node, a first electrode of each eighth transistor is connected with the shift registers to receive the output signals of the shift registers, and a rate of each eighth transistor is connected with the second node.

2. The drive circuit according to claim 1, wherein the first switch circuit comprises:
a first control sub-circuit which is configured to selectively output the first voltage or a second voltage to a first node based on the first control signal and the second control signal; and
a plurality of first switch sub-circuits, which are configured to selectively output the output signals of the shift registers or the first voltage to a first display screen based on the first control signal and the voltage of the first node, and
the second switch circuit comprises:
a second control sub-circuit which is configured to selectively output the first voltage or the second voltage to a second node based on the third control signal and the fourth control signal; and
a plurality of second switch sub-circuits, which are configured to selectively output the output signals of the shift registers or the first voltage to a second display screen based on the fourth control signal and the voltage of the second node.

3. The drive circuit according to claim 2, wherein the first control sub-circuit comprises a first transistor and a second transistor, each of the first switch sub-circuits comprises a fifth transistor and a sixth transistor; and
the second control sub-circuit comprises a third transistor and a fourth transistor, and each of the second switch sub-circuits comprises a seventh transistor and an eighth transistor.

4. The drive circuit according to claim 3, wherein
a first electrode of the second transistor is connected with the first node, a gate of the second transistor is connected with a second control signal terminal to receive the second control signal, and a second electrode of the second transistor is connected with a second voltage terminal to receive the second voltage;
a first electrode of the third transistor is connected with the second node, a gate of the third transistor is connected with a third control signal terminal to receive the third control signal, and a second electrode of the third transistor is connected with the second voltage terminal to receive the second voltage;
a first electrode of the fifth transistor is connected with the first voltage terminal to receive the first voltage, a gate of the fifth transistor is connected with the first control signal terminal to receive the first control signal, and a second electrode of the fifth transistor is connected with a second electrode of the sixth transistor;
a first electrode of the seventh transistor is connected with the first voltage terminal to receive the first voltage, a gate of the seventh transistor is connected with the fourth control signal terminal to receive the fourth control signal, and a second electrode of the seventh transistor is connected with a second electrode of the eighth transistor.

5. The drive circuit according to claim 3, wherein the first transistor, the second transistor, the third transistor, the fourth transistor, the fifth transistor, the sixth transistor, the seventh transistor and the eighth transistor are P-type transistors.

6. The drive circuit according to claim 3, wherein the first transistor, the second transistor, the third transistor, the fourth transistor, the fifth transistor, the sixth transistor, the seventh transistor and the eighth transistor are thin film transistors.

7. The drive circuit according to claim 2, wherein the plurality of the first switch sub-circuits, the plurality of the second switch sub-circuits and the plurality of the shift registers correspond to each other one by one.

8. A display panel, comprising the drive circuit according to claim 1.

9. The display panel according to claim 8, wherein the display panel is a foldable display panel and is foldable at a position between the first display region and the second display region, the first display region and the second display region are located on different sides of the drive circuit respectively when the display panel is unfolded.

10. The display panel according to claim 8, further comprising a plurality of sub-pixel units, wherein light emitting regions of a part of the sub-pixel units overlap the drive circuit.

11. The display panel according to claim 10, wherein light emitting regions of the plurality of sub-pixel units cover the drive circuit.

12. The display panel according to claim 10, wherein the plurality of sub-pixel units comprise a first sub-pixel unit and a second sub-pixel unit, and a light emitting region of the first sub-pixel unit has a size larger than that of a light emitting region of the second sub-pixel unit.

13. The display panel according to claim 10, wherein a part of a light emitting region of the first sub-pixel unit overlaps the drive circuit.

14. A display device, comprising the display panel according to claim 8.

15. The display device according to claim 14, further comprising a full screen control switch, a first display region control switch, and a second display region control switch,
wherein the full screen control switch is configured for switching on or switching off the first display region and the second display region simultaneously,
the first display region control switch is configured for switching on or switching off the first display region individually, and
the second display region control switch is configured for switching on or switching off the second display region individually.

16. A method of driving the drive circuit of claim 1, comprising:
in a case that a first display region and a second display region display simultaneously, setting the first control signal to be an OFF voltage, setting the second control signal to be an ON voltage, setting the third control signal to be an ON voltage and setting the fourth control signal to be an OFF voltage;
in a case that the first display region displays individually, setting the first control signal to be an OFF voltage, setting the second control signal to be an ON voltage, setting the third control signal to be an OFF voltage and setting the fourth control signal to be an ON voltage; and
in a case that the second display region displays individually, setting the first control signal to be an ON voltage, setting the second control signal to be an OFF voltage, setting the third control signal to be an ON voltage and setting the fourth control signal to be an OFF voltage.

* * * * *